(12) United States Patent
Vacar et al.

(10) Patent No.: US 7,982,468 B2
(45) Date of Patent: Jul. 19, 2011

(54) APPARATUS AND METHOD FOR TESTING ELECTRICAL INTERCONNECTS WITH SWITCHES

(75) Inventors: Dan Vacar, San Diego, CA (US); David K. McElfresh, San Diego, CA (US); Robert H. Melanson, San Diego, CA (US); Leoncio D. Lopez, Escondido, CA (US)

(73) Assignee: Oracle America, Inc., Redwood City, CA (US)

( * ) Notice: Subject to any disclaimer, the term of this patent is extended or adjusted under 35 U.S.C. 154(b) by 413 days.

(21) Appl. No.: 12/048,133

(22) Filed: Mar. 13, 2008

(65) Prior Publication Data

US 2009/0230977 A1 Sep. 17, 2009

(51) Int. Cl.
*G01R 31/04* (2006.01)

(52) U.S. Cl. .................... 324/538; 324/523; 324/754.18

(58) Field of Classification Search ................. 324/512, 324/522, 523, 525, 527, 537, 538, 555, 754–765, 324/754.18
See application file for complete search history.

(56) References Cited

U.S. PATENT DOCUMENTS

| | | | | |
|---|---|---|---|---|
| 3,825,824 A * | 7/1974 | Herron et al. | ................. | 324/538 |
| 4,587,481 A * | 5/1986 | Lischke et al. | ................. | 324/538 |
| 4,829,238 A * | 5/1989 | Goulette et al. | ............. | 324/750 |
| 5,006,788 A * | 4/1991 | Goulette et al. | ............. | 324/501 |
| 5,574,668 A * | 11/1996 | Beaty | .............................. | 324/754 |
| 5,661,409 A * | 8/1997 | Mohsen | ........................ | 324/765 |
| 6,268,738 B1 * | 7/2001 | Gunthorpe et al. | ........... | 324/750 |
| 6,559,667 B1 * | 5/2003 | Tarter | ............................. | 324/760 |
| 6,731,124 B2 * | 5/2004 | Donners | ........................ | 324/756 |
| 7,385,410 B2 * | 6/2008 | Payman | ........................ | 324/537 |
| 2005/0088195 A1 * | 4/2005 | Grilletto | ........................ | 324/765 |

* cited by examiner

*Primary Examiner* — Timothy J Dole
(74) *Attorney, Agent, or Firm* — Polsinelli Shughart PC

(57) ABSTRACT

A test system including a package with switchable paths. The package may have conductive paths that are selected by switches. The electrically switchable conductive paths may yield increased data without significantly increasing the required testing hardware.

17 Claims, 6 Drawing Sheets

APPARATUS AND METHOD FOR TESTING ELECTRICAL INTERCONNECTS WITH SWITCHES

FIELD OF THE INVENTION

The present invention generally relates to the testing of electrical assemblies and more specifically to a test system with switchable test paths.

BACKGROUND

Electrical assemblies include a printed circuit board and a package, such as an integrated circuit, electrically connected to the printed circuit board. This electrical connection is often made with an interposer or socket, which may be inserted between the printed circuit board and the package. The interposer allows the printed circuit board and the package to electrically connect to one another through the interface connections on the interposer. The electrical connection, via the interposer interface connections, between the printed circuit board and the package may be a point-to-point connection.

Factors, such as manufacturing defects, degrading interfaces and degrading materials may cause an electrical assembly to fail. The quality and robustness of the assembly may be monitored for failures and also monitored to determine the faults causing the failures. Further, an electrical assembly may be tested for characterization purposes. One factor that may cause a fault in an electrical assembly is the degradation of interposer interface connections. The degradation of interposer interface connections may be monitored for shifts in electrical values. Another factor that may cause a fault in an electrical assembly is the degradation of materials used to form an interface connection such as the material used for solder joints. The material degradation may also be detected by monitoring shifts in electrical values.

Currently, the increasing complexities of electronic assemblies are placing increasing demands on test system methods, from both mechanical and electrical standpoints. For example, it is not uncommon for current electronic systems to include integrated circuits with a very large number of contact pads. While it may not be necessary to test each and every contact pad, the mere fact that the number of contact pads are increasing typically means an increase in the number of test points that must be monitored in order to effectively test the electrical system. Further, the number of interface connections or solder joints is increasing with the number of contact pads on the integrated circuit package. As a result, testing is increasingly difficult as the number of interface connections or solder joints is significantly increasing and the number of test nodes available for test equipment connection is not significantly increasing. The result is a number of interface connections cannot be directly tested, making it difficult to determine the point or points of degradation. Further, characterization of the electrical assembly also becomes more difficult.

Accordingly, there is a need in the art for an improved test system and increased granularity of test data points in the test system. As will be recognized from the discussion below, these and other problems in the art are addressed by various systems and methods conforming to aspects of the present invention. Before explaining the disclosed embodiments in detail, it is to be understood that the invention is not limited in its application to the details of the particular arrangement shown, because the invention is capable of other embodiments. Moreover, aspects of the invention may be set forth in different combinations and arrangements to define inventions unique in their own right. Also, the terminology used herein is for the purpose of description and not of limitation.

SUMMARY

Generally, one aspect of the present invention includes a test system. The test system comprises a printed circuit board defining a first plurality of conductive paths. Each of the plurality of conductive paths may be associated with a respective first group of connection points. The test system also involves a package defining a second plurality of conductive paths. Each of the plurality of conductive paths may be associated with a respective second group of connection points. Additionally, the test system involves a plurality of interface connections interconnecting individual connection points of the first group of connection points to individual connection points of the second group of connection points. Further, the test system involves a plurality of switches, where each of the plurality of switches may be associated with a corresponding interface connection of the plurality of interface connections such that an electrical signal may be provided between one of the first plurality of conductive paths through a respective interface connection to one of the second plurality of conductive paths.

Another aspect involves a test method. The test method comprises providing a printed circuit board defining a first plurality of conductive paths. Each of the plurality of conductive paths may be associated with a respective first group of connection points. The test method also involves providing a package defining a second plurality of conductive paths where each of the plurality of conductive paths may be associated a respective second group of connection points. The test method also involves providing a plurality of interface connections interconnecting individual connection points of the first group of connection points to individual connection points of the second group of connection points and providing a plurality of switches where each of the plurality of switches may be associated with a corresponding interface connection such that an electrical signal may be provided between one of the first plurality of conductive paths through a respective interface connection to one of the second plurality of conductive paths. Further, the test system involves applying a first electrical signal to at least one of the first plurality of conductive paths and applying a second electrical signal to at least one of the second plurality of conductive paths. The first and second electrical signals are sufficient to activate at least one of the plurality of switches such that there may be electrical continuity between at least one of the first plurality of conductive paths, one of the interface connection, and one of the second plurality of second conductive paths.

It should be noted that embodiments of the present invention may be used in a variety of test systems or electrical assemblies, including printed circuit board assemblies. The embodiment may include a variety of boards, sockets, interposers, assemblies with solder joints and packages. Aspects of the present invention may be used with practically any apparatus related to packaging or any apparatus that may contain any type of electrical assembly, an integrated circuit, die, substrate, interconnect material, interposer or board. Accordingly, embodiments of the present invention may be employed in computer equipment packaging and/or peripherals, and electronics device with an integrated circuit or die and so on.

These and other advantages and features of the present invention will become apparent to those of ordinary skill in the art upon reading this disclosure in its entirety.

DETAILED DESCRIPTION OF EMBODIMENTS

Figure 1A:
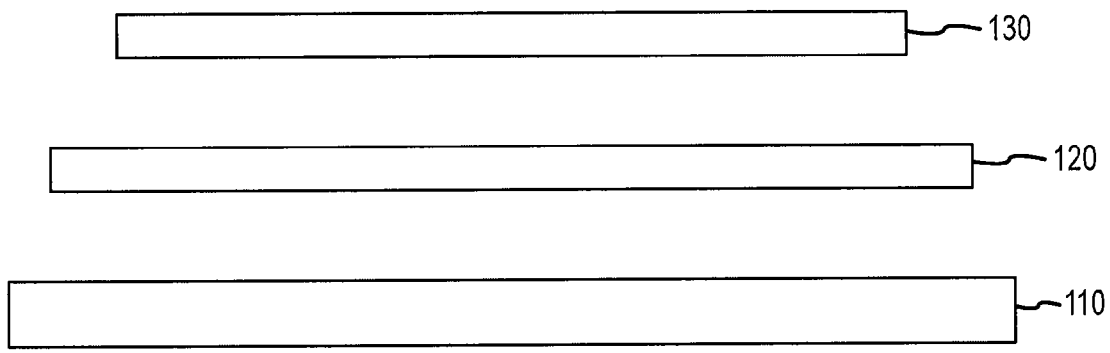
FIG. 1A depicts a cross-section of an electrical assembly, including a test package with a plurality of switching elements.
Figure 1A:
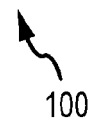

Aspects of the present invention involve a test and characterization system capable of testing individual interface connections, in one example. Interface connections may occur in any number of electrical assemblies, including between a printed circuit board, an interposer and a package. One aspect of the test and characterization system involves a test package configured with a plurality of electrical connections intended to be tested and/or characterized. Each electrical connection may be associated with a respective switching element, such as a diode, transistor, or the like. By allowing the particular switching element associated with a target interface connection to conduct, a unique electrical path through the corresponding interface connection may be achieved thereby allowing targeted testing and characterization of individual interface connections. The characterization of the individual interface connections may include, but is not limited to monitoring the reliability of the interface connections.

In testing for failures caused by factors such as, but not limited to, the degradation of interface connections or material degradation, the test hardware may connect to the electrical assembly via test nodes. The test nodes may be located at each end of an electrical path. In one example, the electrical path electrically connects the printed circuit board, the interposer and the package via an interposer interface connection; thus, the electrical path passes through one interposer interface connection. An electrical path that passes through one interposer interface connection may yield information regarding the one interposer interface connection when tested. One drawback of conventional approaches is that the number of interposer interface connections available for testing far outnumbers the number of test nodes available for connection to test equipment. Similarly, when testing for failure points in an assembly with the printed circuit board soldered directly to the package, the number of connection points may far outnumber the number of test nodes available for test equipment connection.

A test system that conforms to aspects of the invention may include a package with switches that may enable the electrical connection of conductive paths, thereby dramatically increasing the number and accuracy of identifiable and locatable fault locations, particularly with individual interface connection locations. The switchable paths allow for a greater yield of data, both measured and determined, without significantly increasing the number of test nodes and without significantly increasing the amount of required test hardware.

An electrical assembly may include electrically controlled or switchable electrical paths. Further, an electrical assembly may include a package such as, but not limited to, a test package or a daisy chain package. A package may be located adjacent to a printed circuit board or may also be located adjacent to an interposer. In one embodiment, a test system may include a package and a printed circuit board. The package and printed circuit board may be designed for use together in the electrical assembly. Daisy chain packages or daisy chain boards may include segments of electrical paths or daisy chains where the segments of electrical paths or daisy chains may be comprised of low resistance material as discussed in U.S. patent application Ser. No. 12/048,085 titled "Apparatus and Method for Testing Electrical Interconnects", filed on Mar. 13, 2008, which is herein incorporated by reference. The daisy chain package or the daisy chain board may include a segment of an electrical path, where the electrical path in its entirety may be connected at each end to at least two nodes. A first individual node may be located at one end of an electrical path and a second individual node may be located at the other end of the electrical path. Electrical paths may be used for measuring various electrical characteristics such as, but not limited to, resistance, impedance, signal integrity, current, voltage and so on. Accordingly, the electrical characteristics may be direct current quantities and alternating current quantities.

In another embodiment, electrical characteristics, such as resistance or impedance, may be measured for one, several or all of the electrical paths, again with one or more interface connections being a part of the electrical paths. The electrical quantities set forth in this example are for explanatory purposes as other electrical quantities may be measured as well. In one example, a first voltage may be applied to a first set of conductive paths on a printed circuit board and a second voltage may be applied to a second set of conductive paths on a package. A third voltage may be applied to a selected conductive path on the printed circuit board and a fourth voltage may be applied to a selected conductive path on the package. The first, second, third and fourth voltages may be selected such that switches may be controlled by the voltages. The switches may substantially allow or substantially block current flow depending on the applied voltages. The first, second, third and fourth voltages may be selected such that one, several or all of the electrical paths may be measured individually by turning the switches on and off. The measurements may monitor electrical characteristics such as, but not limited to, resistance, impedance, signal integrity, current, voltage, and so on.

It should be noted that embodiments of the present invention may be used in a variety of test systems or electrical assemblies, including printed circuit board assemblies. The embodiment may include a variety of boards, sockets, interposers, assemblies with solder joints and packages. Aspects of the present invention may be used with practically any apparatus related to packaging or any apparatus that may contain any type of electrical assembly, an integrated circuit, die, substrate, interconnect material, interposer or board. Accordingly, embodiments of the present invention may be employed in computer equipment packaging and/or peripherals, and electronics device with an integrated circuit or die and so on.

FIG. 1A depicts a cross section of possible elements of an electrical assembly 100. The electrical assembly 100 may be a test assembly or any other type of electrical assembly such as an integrated circuit assembly. The electrical assembly 100 may include a printed circuit board 110, an interposer 120 and a package 130. For purposes of this discussion and not of limitation, the printed circuit board 110 may also be referred to as a test board 110. In FIG. 1A, the printed circuit board 110, interposer 120 and package 130 are illustrated as not physically connected to one another; however, this figure is provided only as an example and for explanatory purposes.

An electrical assembly, such as electrical assembly 100 may include switches that may be located on the package 130. Locating the switches on the package 130 is for explanatory purposes and not of limitation. The switches may also be located on other elements of the electrical assembly 100 such as the printed circuit board 110. The printed circuit board 110 and package 130 may also include conductive paths. By applying voltages to the conductive paths on the printed circuit board 110 and to the conductive paths on the package 130, individual switches may be turned on, thus allowing current to flow. The switches may be activated in any number of ways such as, but not limited to, using voltage, current, mechanical, optical, capacitive, fluid (including air), electron beam, ion beam and acoustic techniques.

In FIG. 1A, the printed circuit board 110, interposer 120 and package 130 may be electrically or operationally connected to one another. An electrical assembly, such as electrical assembly 100, may include printed circuit board 110 which may be electrically connected to package 130. Positioning interposer 120 between the printed circuit board 110 and package 130 may electrically connect the printed circuit board 110 and package 130. The printed circuit board 110 may be, but is not limited to, a daisy chain board or a test board. Interposer 120 may have interface connections that allow the interposer 120 to form an electrical connection between the printed circuit board 110 and package 130. The interface connections may be individually tested by applying voltages to the conductive paths on the printed circuit board 110 and on the package 130, thus turning the corresponding switch on. Further, the interface connections on interposer 120 may electrically connect the printed circuit board 110 to the interposer 120 with an interface point on the printed circuit board side. The interface connections on interposer 120 may also electrically connect the interposer 120 to the package 130 with an interface point on the package side. For purposes of the discussion herein, interface connections may have an interface point on the printed circuit board side and an interface point on the package side. The connections between the package 130, the interposer 120 and printed circuit board 110 may be point-to-point connections. The interposer 120 will be discussed in more detail below.

Figure 1B:
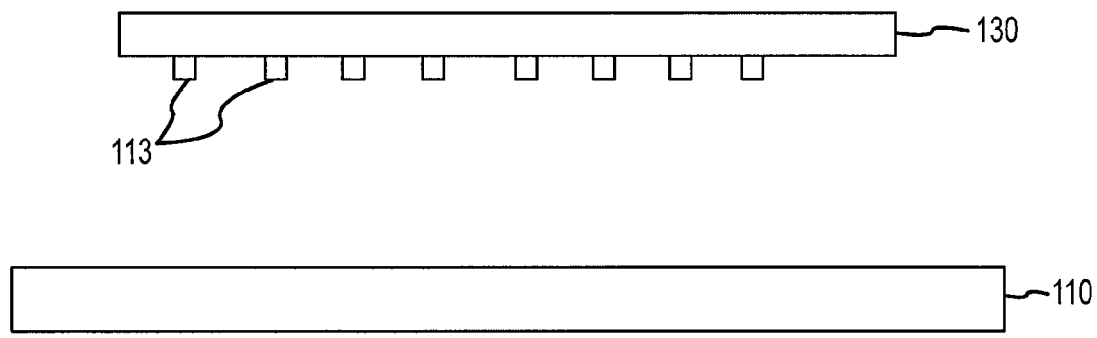
FIG. 1B depicts a cross-section of another embodiment of an electrical assembly, including a test package with a plurality of switching elements.

As depicted in FIG. 1B, it is also possible to electrically connect the printed circuit board 110 and the package 130 by soldering the package 130 to the printed circuit board 110. In FIG. 1B, where the package 130 is soldered directly to the printed circuit board 110, the solder joints may form the electrical connection between the printed circuit board 110 and the package 130. Additionally, an electrical assembly with a printed circuit board, and a package (omitting the interposer) may also have interface connections that may electrically connect the printed circuit board to the package with an interface point on the printed circuit board side and electrically connect the package to the printed circuit board with an interface point on the package side. The interface connections may be tested for failure analysis or for characterization purposes.

Surface mount packaging is one method of electrically connecting one or multiple electrical components to a printed circuit board. Surface mount packaging may also be used for electrical connections between integrated circuit packages, for example, and printed circuit boards. The electrical connection between the integrated circuit package and the printed circuit board may be made either by positioning an interposer between the printed circuit board and the integrated circuit package or by soldering the integrated circuit package directly to the printed circuit board. Additionally, the electrical connection between the integrated circuit package and the printed circuit board may be made by soldering the socket to the printed circuit board or by using any other electrically conductive material or component. As shown in FIG. 1A, an interposer 120 may be used for an electrical connection between the package 130 and the test board 110.

An electrical assembly may be tested for a number of reasons including manufacturing issues, reliability or for characterization purposes. Shifts in electrical values may indicate early failure issues and accordingly electrical assemblies may be tested and monitored over time to evaluate the stability or robustness of an electrical assembly. For example, the interface connections or interconnect material may be subject to degradation and this interconnect degradation may be tested for product reliability purposes. It is possible for the interconnect degradation or the quality of the electrical connections to change over time and this change may be reflected in various electrical measurements. For at least this reason, the reliability and robustness of the electrical connections formed by the interface connections may be monitored. Accordingly, it may be desirable to monitor the quality of the interface connections over a period of time. Further, any number of electrical quantities including, but not limited to, resistance, signal integrity, impedance, voltage or current may be monitored.

Industry trends of product miniaturization include product revisions such as decreasing the size of packages and also decreasing the size of the contacts on the packages. Due to this product miniaturization, the number of electrical connections between components such as interface connections on an interposer or solder joints, may increase. (It is also possible for the packages to increase in size even though the connections are decreasing in size.) Accordingly, the number of interface connections that may be tested for performance degradation may also increase. Further, the number of test nodes available for test equipment connection may limit the amount of test data. For example, the number of interface connections between the printed circuit board and the package to be tested may be far greater than the number of test nodes available for connection to test equipment. Various testing methods will be discussed in greater detail below with respect to FIGS. 2-5.

In many conventional test systems, if the number of test nodes is 2n, the number of measured test paths is n. In one example, the number of test nodes may be twice the number of test paths. In this example, a first test path may be located between a first and second test node, a second test path may be located between a third and a fourth test node, a third test path may be located between a fifth and a sixth test node and a fourth test path may be located between a seventh and an eighth test node. Thus, there are eight test nodes and four possible test paths. In this conventional electrical assembly example, the test paths include multiple interface connections within the path. Accordingly, if there is a shift in electrical values between sets of measurements, it may not be possible to locate the interface connection that may be degrading or causing the failure. Further in this conventional system, the number of interface connections far outnumbers the test nodes. Thus, in conventional test systems, there is a trade-off between the number of interface connections in each electrical path and the need to monitor or obtain data for most of the interface connections in the test system. As the number of interface connections included in an electrical path increases, the ability to determine the interface connection or sets of interface connections that may have caused the failure decreases. Moreover, as the number of interface connections included in an electrical path decreases, the fewer interface connections are measured, thus producing less data for monitoring or characterizing the interface connections.

As shown in FIG. 1A, the package 130 may be located adjacent to the interposer 120 and the interposer 120 may be located adjacent to the printed circuit board 110. However, as depicted in FIG. 1B, the package 130 may also be located adjacent to the printed circuit board 110. In FIG. 1B, the electrical connections may be solder joints 113 when the package 130 is located adjacent to the printed circuit board 110. The location of the test nodes may also vary and may depend on various factors such as the location of the package 130. Although many of the examples discussed herein locate the test nodes adjacent to the printed circuit board, this is done for explanatory purposes only and not meant as a limitation on the system. Test nodes will be discussed in greater detail below with respect to FIGS. 2-5.

Figure 2:
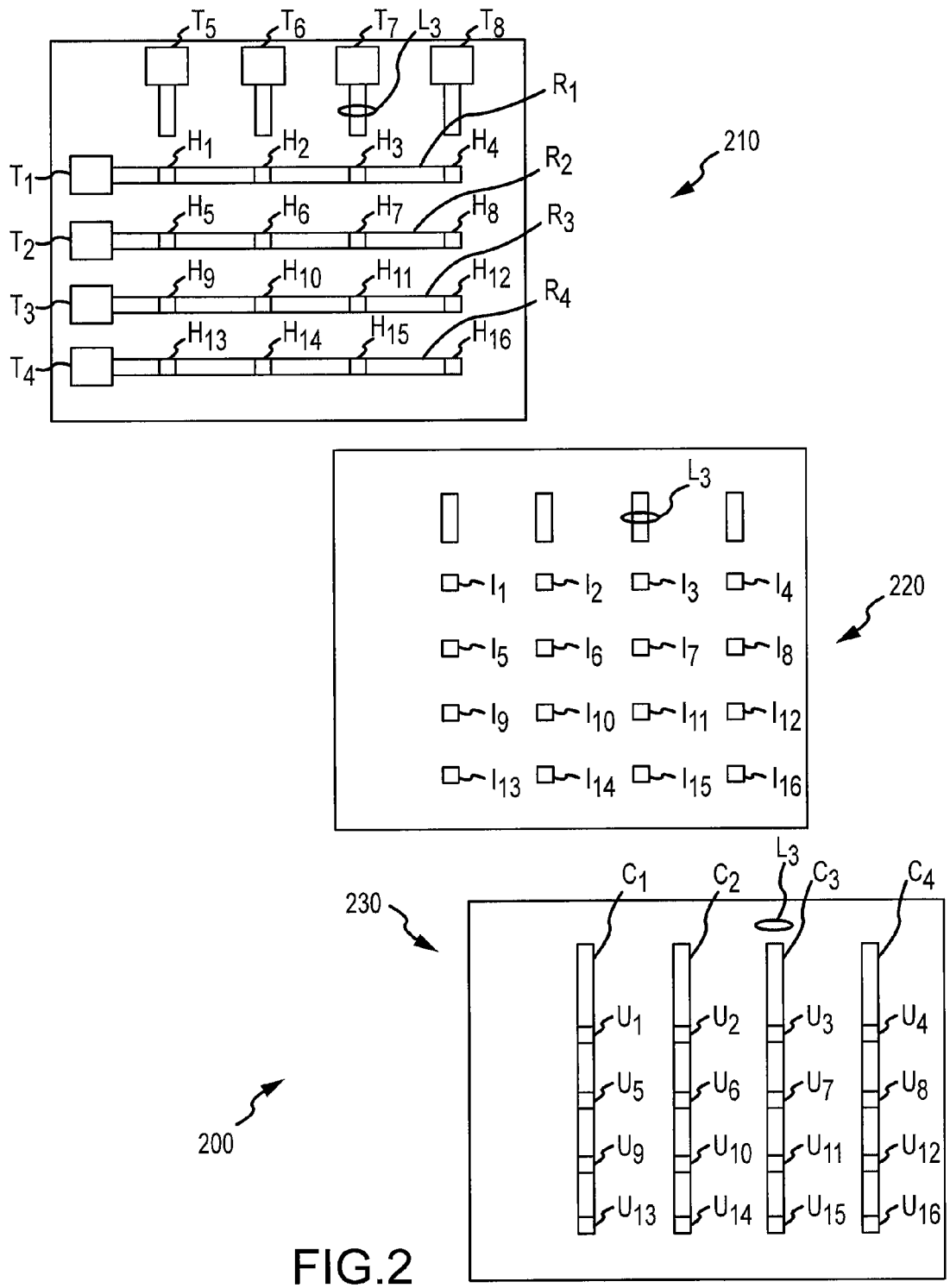
FIG. 2 depicts a top view of the printed circuit board, the interposer and the package of FIG. 1A.

FIG. 2 depicts a top views of separate components of an electrical assembly 200, including a printed circuit board 210, an interposer 220 and a package 230. The printed circuit board 210 may have a plurality of interface connections H1-H4, H5-H8, H9-H12, H13-H16, which may correspond to a plurality of interface connections I1-I4, I5-I8, I9-I12, I13-I16, on the interposer 220 and may similarly correspond to a plurality of interface connections U1-U4, U5-U8, U9-U12, U13-U16 on the package 230. For purposes of explanation and not of limitation, the interface connections are illustrated in corresponding 4×4 patterns on the printed circuit board 210, the interposer 220 and the package 230. It is also possible to have other arrangements and a different number of interface connections. Additionally, other electrical assemblies are possible which may have fewer elements, more elements or different elements than a printed circuit board 210, interposer 220 and package 230. To provide for testing, characterization, or otherwise analyzing a particular interface, the package 230 may have switching elements, such as diodes, corresponding to the interface connections. A given combination of activated and deactivated switching elements allows for the testing of any single interface connection or combination of interface connections.

Generally, electrical assemblies may include a printed circuit board with conductive paths, such as, but not limited to, horizontal conductive paths, vertical conductive paths, diagonal conductive paths or some combination thereof. The printed circuit board 210 may also include interface connections that may electrically connect the printed circuit board 210 to the interface connections on the interposer 220. Additionally, the printed circuit board 210 in FIG. 2, may include horizontally arranged conductive paths R1, R2, R3, R4 (sometimes referred to as "rows") which may electrically connect interface connections in each of the respective rows.

In FIG. 2, the interposer 220 may include interface connections. The interface connections on the interposer 220 may electrically connect the printed circuit board 210 to the interposer 220 at the corresponding interface connections on the printed circuit board 210. Also in FIG. 2, the package 230 may include conductive paths, such as, but not limited to, horizontal conductive paths, vertical conductive paths, diagonal conductive paths or some combination thereof. For example, the conductive paths on the printed circuit board and the package may all be horizontal conductive paths, or all vertical conductive paths or horizontal conductive paths on the printed circuit board and diagonal paths on the package. In FIG. 2 the conductive paths on the packages 230 are in a column arrangement for explanatory purposes and not of limitation. In FIG. 2, each of the vertically illustrated conductive paths C1, C2, C3, C4 may electrically connect the respective interface connections in the respective columns on the package 230.

The assembly 200 may also be configured with a package 230 adjacent to the printed circuit board 210 as depicted in FIG. 1B. In this embodiment of FIG. 2, the interposer 220 is omitted and the solder joints may electrically connect the printed circuit board 210 to the package 230. Further, the assembly may be configured using a daisy chain board and may include the same type of electrical paths as the other configurations. Moreover, the interface connections may be any material, device, element or component that forms an electrical connection.

Figure 3:
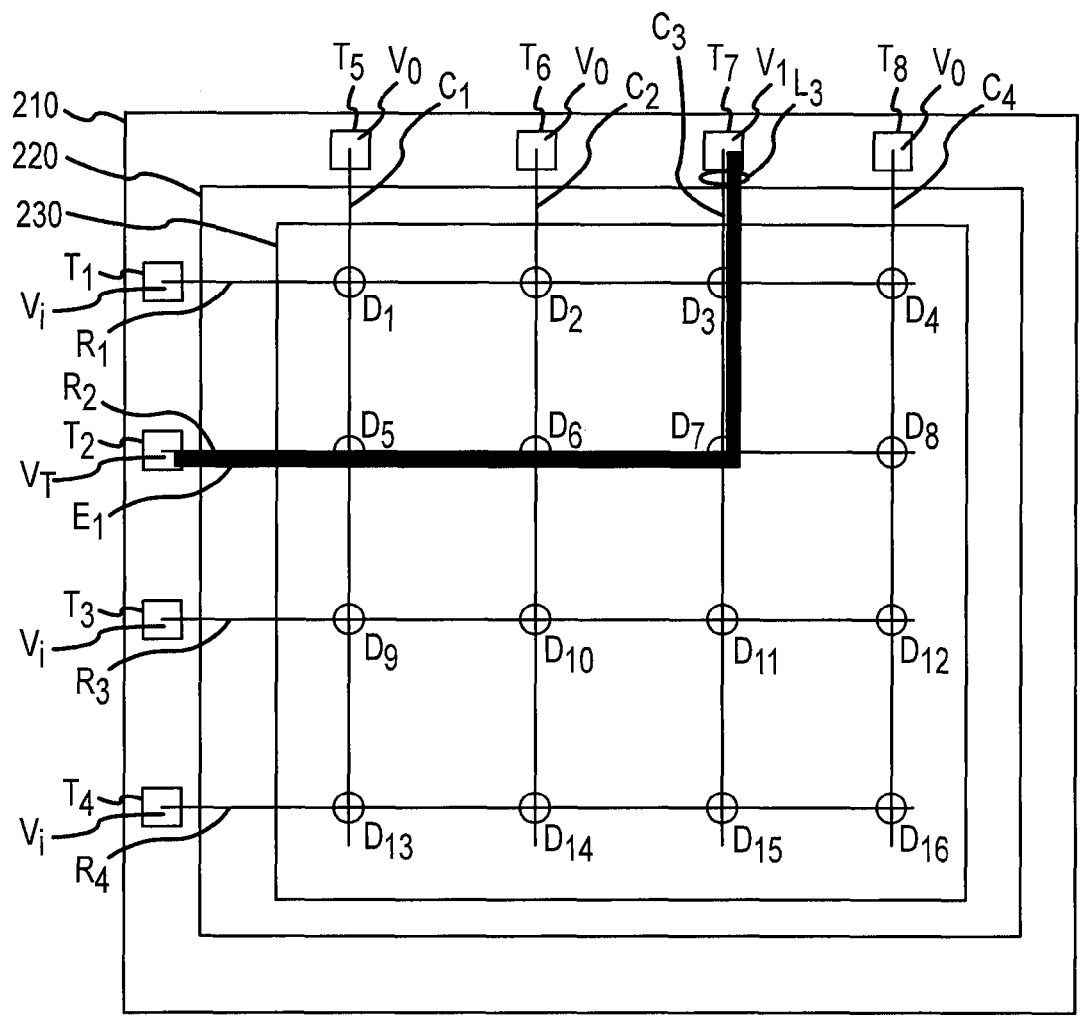
FIG. 3 depicts a top view of an electrical assembly, including diodes as switches and an example of an electrical path connected to test nodes.

FIG. 3 depicts another representation of the electrical assembly in FIG. 2. FIG. 3 is a top view of an electrical assembly 200, including a package 230, an interposer 220, a printed circuit board 210, interface connections, switches, test nodes and conductive paths. The switches may be electrically or operationally connected to the conductive paths on the package 230. For example, conductive path C1 may be electrically connected to switches D1, D5, D9, D13, conductive path C2 may be electrically connected to switches D2, D6, D10, D14, conductive path C3 may be electrically connected to switches D3, D7, D11, D15 and conductive path C4 may be electrically connected to switches D4, D8, D12, D16. Similarly, the switches may be electrically or operationally connected to the conductive paths on the printed circuit board 210. In FIG. 3, the switches are illustrated as diodes for purposes of explanation and not of limitation. The switches may be electrical components, such as but not limited to, diodes, capacitors, transistors and so on. By controlling the switches or electrical components, each interface connection or solder joint may be individually monitored through electrical path measurements. It may also be possible to locate the electrical components on the package 230 or on the printed circuit board 210.

FIG. 3 demonstrates one way that switches may define the electrical paths. By appropriately biasing the switches to electrically define the electrical paths, it is possible to increase the number of measurable electrical paths without increasing the number of test nodes. In the example of FIGS. 2-3, there are eight test nodes (T1-T8) and through the selective operation of one of the sixteen switches (D1-D16), it is possible to define sixteen different electrical paths, with each electrical path including one discrete interface connection location.

Generally, in the example of FIGS. 2-3 as well as in other possible implementations, an electrical assembly 200 may include M+N nodes and measurements may be taken for M×N electrical paths. Although the number of conductive paths on the printed circuit board 210 may be different from the number of conductive paths on the package 230, the following example assumes that the number of conductive paths on the printed circuit board 210 and the package 230 are the same for explanatory purposes only. Assuming there are equal numbers of conductive paths on the printed circuit board 210 and the package 230 as in FIG. 3, N may be the number of conductive paths on the printed circuit board 210 or the number of conductive paths on the package 210. Further, every definite electrical path may include one interface connection, thus yielding individual data for every interface connection. Such interfaces, whether interposer connections, solder joints, or the like, may be monitored for various reasons such as for failure detection and characterization. In FIG. 3, every interface connection may be individually measured by electrically controlling the switches to select electrical paths. One embodiment of FIG. 3 may allow the determination of electrical values for each of the individual interface connections in the electrical assembly. The determination of the electrical values for all the interface connections may allow isolation of which interface connection or set of interface connections may have caused the fault or faults in the electrical assembly.

The ability to measure an electrical characteristic of each individual path enables the monitoring of the individual paths for changes in measurement values. For example, the electrical paths may be monitored for changes in electrical values, such as, but not limited to, resistance. Also, a fault in an electrical assembly may be associated with an individual interface connection or a set of interface connections. Other electrical characteristics may be monitored such as impedance, voltage, current, signal integrity and so on.

As previously discussed, the printed circuit board 210, of FIG. 3, may include rows of conductive paths, while the package 230 may include columns of conductive paths. Through selective activation of a particular switch, any individual conductive path on the printed circuit board 210 may electrically connect to any individual conductive path on the package 230. For example, conductive path R3 on the printed circuit board 210 may electrically connect to conductive path C4 on the package 230 when diode D12 is on, or may electrically connect to conductive path C3 on the package 230 when diode D11 is on and so on.

The interposer 220 in FIG. 3 may include interface connections. The interface connections on the interposer 220, may electrically connect the rows of conductive paths R1-R4 on the printed circuit board 210 to the columns of conductive paths C1-C4 on the package 230. For example, connection point H7 (shown in FIG. 2) on the printed circuit board 210 may be connected to connection point U7 (shown in FIG. 2) on the package 230 through a corresponding interface connection I7 (shown in FIG. 2) on the interposer 220. Further, the interface connections on the interposer 220 may correspond on a one-to-one basis to the interface connections on the printed circuit board 210 and to the interface connections on the package 230. The interface connections on the interposer 220 will be discussed in greater detail below.

Also, in FIG. 3, each electrical path may pass through one interface connection on the interposer 220. Accordingly, each individual interface connection on the interposer 320 may be measured. The measurement of every interface connection, including interposer interface connections or solder joints, increases the likelihood of identifying and locating or isolating a fault and associating the fault with a degraded interface connection or degraded solder joint.

Figure 4:
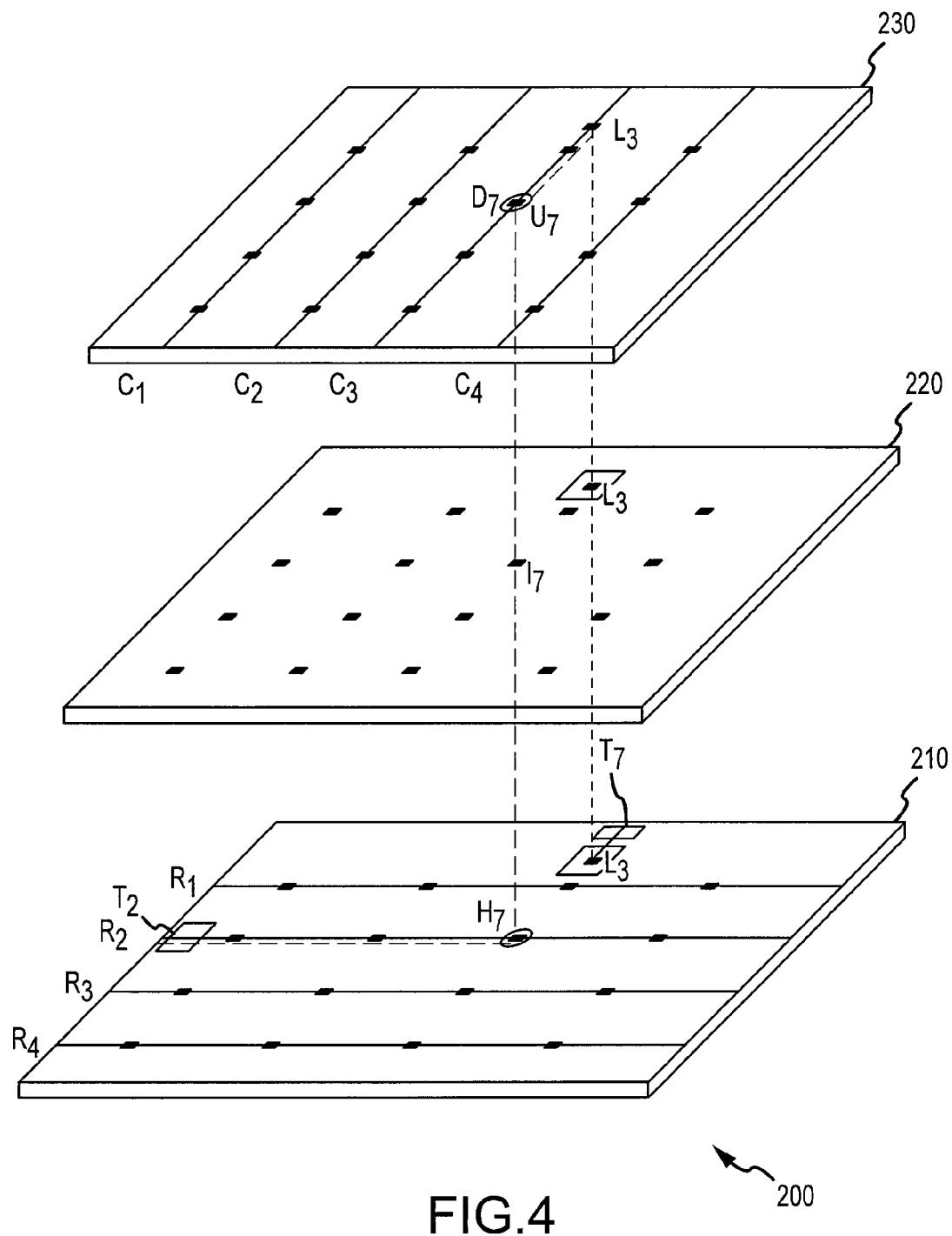
FIG. 4 depicts an isometric exploded view of the electrical assembly of FIG. 3, including an example of an electrical path.

Referring primarily to FIGS. 3-4, an electrical path, such as electrical path E1, may begin at a first test node T2 and includes a conductive path R2 on the printed circuit board 210. Then at the interface connection H7, the electrical path E1 may electrically connect to the interposer 220 through a corresponding interface connection I7 on the interposer 220, where the interface connection I7 on the interposer 220 electrically connects the printed circuit board 210 to the interposer 220. Further, the corresponding interface connection I7 on the interposer 220 connects the printed circuit board 210 to the interposer 220 through an interface point located on the printed circuit board side of the interposer 220. Next, the electrical path E1 continues to an interface connection point U7 on the package 230, where the interface connection I7 on the interposer 220 electrically connects interposer 220 to the package 230 at the connection point U7. The interface connection I7 on the interposer 220 connects the package 230 to the interposer 220 through an interface point located on the package side of the interposer 220.

Continuing this example, the diode D7 associated with connection point U7 is on (conductive), while the other diodes are off (not conductive). In the following examples, a diode may be referred to as "on" when the diode allows current to flow. Similarly, a diode may be referred to as "off" when the diode prohibits or substantially prohibits current flow. The electrical path E1 continues along a conductive path C3 on the package 230 toward the edge of package 230. The electrical path E1 then continues to a location L3 where the electrical path E1 electrically connects the package 230 to the interposer 220 through an interface connection on the interposer 220. The interface connection on the interposer 220 electrically connects the package 230 to the interposer 230 through an interface point located on the package side of the interposer 220. The electrical path E1 continues from the interposer 220 to the printed circuit board 210, where an interface connection on the interposer 220 electrically connects the interposer 220 to the printed circuit board 210. The interface connection on the interposer 220 electrically connects the printed circuit board 210 to the interposer 220 through an interface point located on the printed circuit board side of the interposer 220. The electrical path E1 then terminates at a second test node T7.

There may also be diodes in each column arrangement of the conductive paths at the package level (D1, D5, D9, D13; D2, D6, D10, D14; and soon.) A voltage potential that may be applied across each diode may be controlled by applying voltages to the rows and columns of conductive paths sufficient to turn at least one diode on. The row and column arrangement set out in FIG. 2 and FIG. 3 is illustrative as other arrangements may also be possible. By applying the proper voltage potential across a given diode, a particular interface may be tested and/or characterized. To isolate a particular interface connection for testing, characterization and so on, the diode associated with the interface connection is biased to allow conduction (on) and the other diodes are biased to prohibit conduction (off). In the example of FIG. 3, appropriate voltages may be applied to the conductive paths of the printed circuit board and the package such that only one diode may be conductive, thus allowing measurement of an electrical path that includes the single interface connection associated with the diode.

The electrical assembly in FIG. 3 may be arranged such that each switch may be individually biased. A switch may be a number of electrical components such as a diode, transistor, capacitor and so on. In this example, a diode is used as a switch. Thus, each diode may be individually biased with a voltage across the diode sufficient to allow the diode to conduct (on) or a voltage across the diode sufficient to substantially prohibit conduction (off). In the example of FIG. 3, each diode may be operationally or directly connected between conductive paths with controllable voltages. Further, the diode may have an electrode operationally or directly connected to one of the rows of conductive paths on the printed circuit board 210 and the other electrode may be operationally or directly connected to one of the columns of conductive paths on the package 230. Each diode may be directly or operationally connected in a similar manner to one another. For example, diodes capable of controlling current flow to define an electrical path may have the anodes electrically connected to the package 230 and the cathodes electrically connected to the printed circuit board 210 while the diodes may be connected in series with the interface connection.

In one embodiment, a plurality of diodes may be physically located on the package or physically located on the printed circuit board. Although the diode may be physically positioned on the package, one electrode of the diode may be operationally connected to the printed circuit board while in series with an interposer interface connection. For example, a diode may be electrically connected to a conductive path on the package 230, connected in series with the interposer connection on the interposer 220 and electrically connected to a conductive path on the printed circuit board 210 through the interposer connection on the interposer 220. The voltages may be applied to the rows of conductive paths of the printed circuit board and also may be applied to the columns of conductive paths of the package as best shown in FIG. 2.

Also, as illustrated in FIG. 2, there may be corresponding individual test nodes T1-T4 on the printed circuit board 210, which may be electrically connected on a one to one basis to each conductive path R1-R4 on the printed circuit board 210. Additionally, as in FIG. 2, there may be test nodes T5-T8 connected to the printed circuit board 210 but not directly connected to the rows of conductive paths R1-R4 on the printed circuit board 210.

In FIG. 3, a voltage may be applied to the columns of conductive paths C1, C2, C3 and C4 to initialize the columns of conductive paths such that the conductive paths C1, C2, C3 and C4 are at the same or substantially similar voltages as one another. Similarly, a voltage may be applied to the rows of conductive paths R1, R2, R3 and R4 to initialize the rows of conductive paths such that the conductive paths R1, R2, R3 and R4 are at the same or substantially similar voltages as one another. For example, a voltage $V_0$ may be applied to each column of the conductive paths C1, C2, C3 and C4. Similarly, a voltage $V_i$ may be applied to each row of the conductive paths R1, R2, R3 and R4.

Next, a predefined voltage may be applied to a selected conductive path of the rows of conductive paths and another predefined voltage may be applied to a selected conductive path of the columns of conductive paths, thus targeting a corresponding diode for activation. The applied predefined voltages may be selected such that only one diode may be activated by the combination of the applied predefined voltages and the other diodes may not be activated. For example, a predefined voltage $V_t$ may be applied to the selected conductive path R2 corresponding to diode D7, on the printed circuit board 210 and a predefined voltage $V_1$ may be applied to the selected conductive path C3, also corresponding to the diode D7, on the package 330. $V_t$ may be applied to the cathode (negative terminal) of diode D7 and $V_1$ may be applied to the anode (positive terminal) of the diode D7. The voltage potential across diode D7 may be sufficient to turn diode D7 on or to allow current to flow. The other diodes in FIG. 3 may be turned off. Hence, a unique electrical path through the interface connections corresponding to diode D7 may be created. Through a proper combination of applied voltages to each row and column, one or more of the diodes may be turned on or off, and accordingly, any particular interface connection may be isolated and tested.

A particular electrical path may be selected by electrically enabling the appropriate switch. Each of the switches may substantially allow current to flow or substantially prohibit current from flowing, depending on the voltages applied to the conductive paths of the electrical assembly. Continuing this example in more detail, an electrical path E1 of FIG. 3 may be measured by applying voltages to the conductive paths that satisfy the voltage inequality EQ1 below. The electrical path E1 may be provided between test node T2 along conductive path R2 to the interface connection H7 on the printed circuit board 210. The printed circuit board 210 may be electrically connected to the interposer 220 through an interface connection I7 on the interposer 220, at the interface connection H7, through an interface point on the printed circuit board side of the interposer. In FIG. 3, the interface connection I7 on the interposer 220 electrically connects the printed circuit board 210 to the interposer 220 and the corresponding interface connection I7 on the interposer 220 may be tested as diode D7 may be on, thus allowing current to flow.

In this example, voltages may be applied in accordance with a system of inequalities EQ1 in FIG. 3. The system of inequalities EQ1 defines the relationship between the applied voltages as the following:

$$EQ1 = V_i < V_1 < V_T < V_0$$

In the system of inequalities EQ1, the difference between any two of the voltages may be a value sufficient to turn a switch on or allow current to flow.

In this example, an idle voltage, $V_i$ may be applied to all rows of conductive paths, R1, R2, R3, R4. The voltage, $V_i$ may be selected such that the voltage, $V_i$ is less than the other voltages $V_1$, $V_T$ and $V_0$ that may be applied to the other conductive paths. Next in this example, a voltage $V_0$ may be applied to all columns of conductive paths C1, C2, C3, C4. Voltage $V_0$ may be selected such that voltage $V_0$ is greater than the other voltages $V_i$, $V_1$, $V_T$ that may be applied to the other conductive paths. A voltage, $V_T$, may be applied to conductive path R2. Accordingly, interface connections H5-H8 may also be at the same or similar voltage $V_T$ as the conductive path R2. Further, in this example, voltage $V_T$, may be selected such that voltage $V_T$ is greater than voltages $V_i$ and $V_1$ but less than the voltage $V_0$. A voltage, $V_1$ may be applied to conductive path C3, thus conductive path C3 may be at the same or similar applied voltage, $V_1$. Interface connections U3, U7, U11, U13 may then be at the same or similar voltage, $V_1$. By applying the appropriate voltages conforming to the system of inequalities EQ1 to the appropriate conductive paths, diode D7 may turn on and substantially allow current to flow while the other diodes may be turned off and substantially prevent current from flowing. Additionally, in this example, electrical path E1 has one corresponding interface connection I7 of the interposer 220, thus yielding test data for interface connection I7.

FIG. 4 depicts another representation of the electrical assembly as discussed in FIGS. 2-3. The electrical assembly 200 in FIG. 4 includes an example of an electrical path E1. The electrical assembly 200 includes printed circuit board 210, interposer 220, package 230, an example of an electrical path, conductive paths, test nodes and switches. The printed circuit board 210 in FIG. 4 includes conductive paths R1, R2, R3, R4 which correspond to conductive paths R1, R2, R3, R4 in FIG. 3. Printed circuit board 210 also includes nodes and interface connections. The interposer 220 includes interface connections and the package 230 includes conductive paths C1, C2, C3, C4 which correspond to conductive paths C1, C2, C3, C4 in FIG. 3.

FIG. 4 includes an example of an electrical path E1. Electrical path E1 corresponds to electrical path E1 in FIG. 3. In FIG. 4, an electrical path, such as electrical path E1, may begin at test node T2 on the printed circuit board 210, connect to a conductive path R2 on the printed circuit board 210 and connect to the interface connections H5 and H6. At interface connection H7, the electrical path E1 connects to the interposer 220, making electrical contact through an interface connection I7 on the interposer 220. The interface connection I7 on the interposer 220 connects the printed circuit board 210 to the interposer 220 through an interface point located on the printed circuit board side of the interposer 220. The electrical path E1 then continues to a vertical connection point U7 on the package 230, where the interface connection I7 on the interposer 220 electrically connects the interposer 220 to the package 230. The interface connection I7 on the interposer 220 electrically connects the package 230 to the interposer 220 through an interface point located on the package side of the interposer 220. The electrical path E1 then continues along vertical conductive path C3 toward the edge of package 230. At connection path location L3, the electrical path E1 electrically connects to an interface connection on the interposer 220 through an interface point on the package side of the interposer 220. The electrical path 220 then connects to the printed circuit board 210 through an interface connection on the interposer 220. The interface connection electrically connects the printed circuit board 210 to the interposer 220 through an interface point on the printed circuit board side of the interposer 220. In this example, the switch D7 associated with interface connection U7 is on, while the other switches are off.

Figure 5:
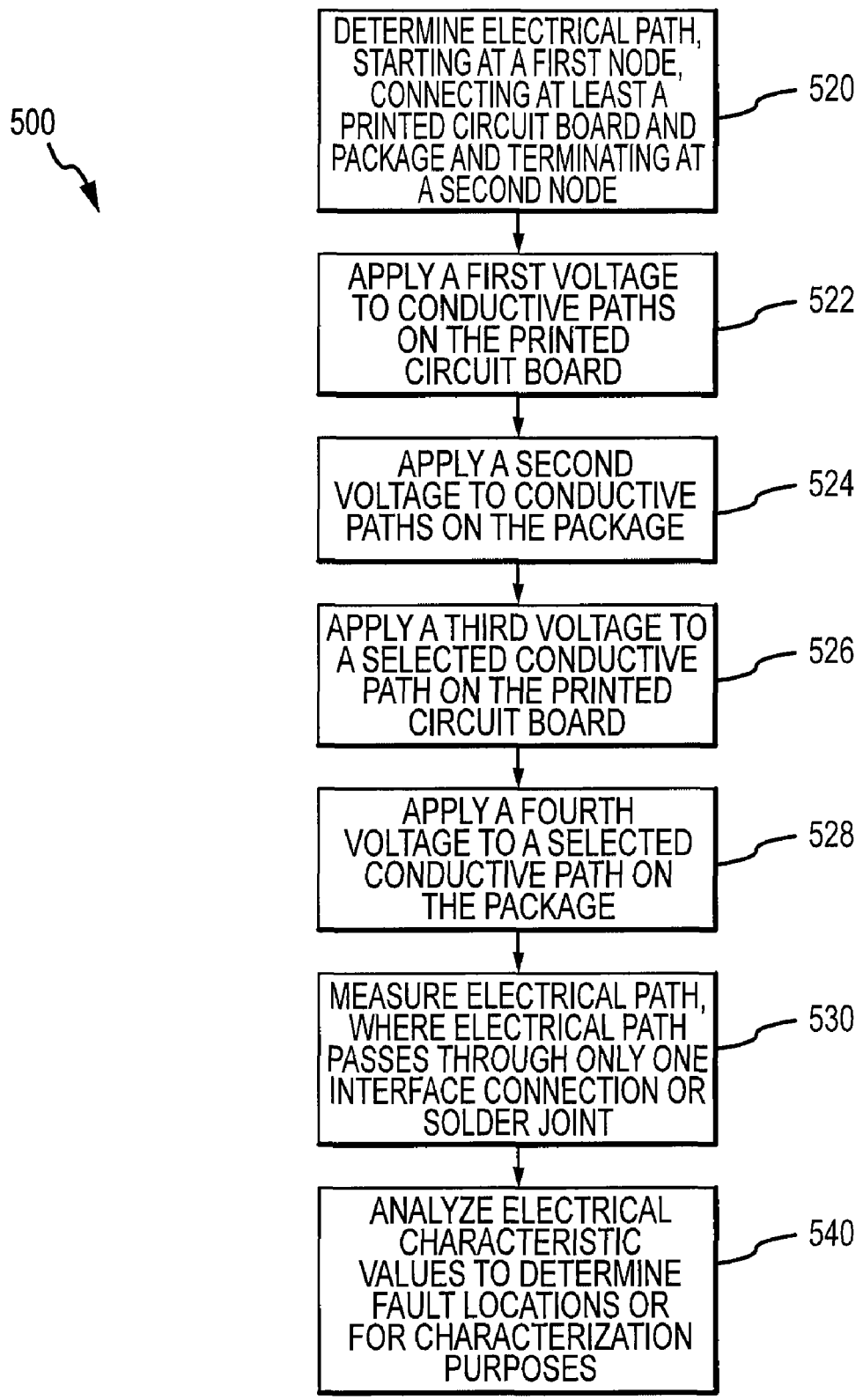
FIG. 5 depicts a flow chart illustrating one example of a method of testing and/or characterizing individual paths and associated individual interface connections.

FIG. 5 depicts an exemplary method flow chart 500 of the present invention. The flow chart 500 begins with block 520, the operation of determining the electrical path for measurement starting at a first node, connecting to at least a printed circuit board and package and terminating at a second node. The electrical path selected for measurement may be an electrical path including multiple interface connections or an electrical path including only one interface connection. In an exemplary embodiment, all the selected electrical paths may pass through an interface connection, such that every interface connection in the electrical assembly is measured. However, an electrical path may be selected that does not pass through an interface connection. The likelihood of detecting degraded interfaces increases as more interface connections are measured or monitored. Accordingly, there is a high probability of detecting a degrading interface connection as each interface connection may be measured.

In the operation of block 522, a first voltage may be applied to the conductive paths on the printed circuit board. The first applied voltage may be a voltage that is less than the other voltages applied to the other conductive paths. In the operation of block 524, a second voltage may be applied to the conductive paths on the package. The second applied voltage may be a voltage that is larger than the other voltages applied to the other conductive paths. The operation of block 522 and the operation of block 524 may be applied in the reverse order. For example, the operation of block 524 may be the first voltage applied and the operation of block 522 may be the second voltage applied.

Next, in the operation of block 526, a third voltage may be applied to a selected conductive path on the printed circuit board. The third voltage applied to the selected conductive path on the printed circuit board, may be greater than the first voltage applied to the conductive paths on the printed circuit board, but less than the second voltage applied to the conductive paths on the package.

In the operation of block 528, a fourth voltage may be applied to a selected conductive path on the package. The operation of block 526 and the operation of block 528 may be applied in the reverse order. For example, the operation of block 528 may be the third voltage applied and the operation of block 526 may be the fourth voltage applied. The fourth voltage applied to the selected conductive path on the package may be greater than the first voltage applied to the conductive paths on the printed circuit board, but less than the third voltage applied to the selected conductive path on the printed circuit board and also less than the second voltage applied to the conductive paths on the package. By applying the voltages described in operations 522, 524, 526 and 528 an electrical path may be defined for measurement.

In the operation of block 530, the electrical path may be measured. The electrical path may pass through only one interface connection or solder joint. Further, in the operation of block 540, the measured electrical values may be used to determine a fault location or may be used for characterization purposes. In the case of determining a fault location, the electrical values may be monitored for changes in value that may indicate a manufacturing defect or degrading interface material. Each electrical path may pass through only one interface connection on the interposer or solder joint connecting the printed circuit board to the package, thus, the interface connection that is defective or degraded may be located. For example, a first set of electrical measurements may be taken, where each electrical path passes through only one interface connection and then a second set, third set, fourth set and so on, of electrical measurements may be taken. Continuing the example, the electrical value of an electrical path may shift from one set of measurements to the next and the interface connection may be located that is causing the shift in the electrical path measurements.

Although the present invention has been described with respect to particular apparatuses, configurations, components, systems and methods of operation, it will be appreciated by those of ordinary skill in the art upon reading this disclosure that certain changes or modifications to the embodiments and/or their operations, as described herein, may be made without departing from the spirit or scope of the invention. Accordingly, the proper scope of the invention is defined by the appended claims. The various embodiments, operations, components and configurations disclosed herein are generally exemplary rather than limiting in scope.

The invention claimed is:

1. A test system comprising:
   a printed circuit board defining a first plurality of conductive paths, each of the first plurality of conductive paths associated with a respective first group of connection points;
   a package defining a second plurality of conductive paths, each of the plurality of second conductive paths associated with a respective second group of connection points and comprising a switch;
   an interposer located between the printed circuit board and the package comprising a first side, second side, and a plurality of interface connections, the first side interconnecting first corresponding individual connection points of the first group of connection points via first interface points, the second side interconnecting second corresponding individual connection points of the second group of connection points via second interface points; and
   wherein each of the plurality of switches is associated with a corresponding interface connection of the plurality of interface connections such that an electrical signal may be provided along a selected conduction path, the selected conduction path connecting one of the first plurality of conductive paths through at least two of the plurality of interface connections to one of the second plurality of conductive paths; wherein at least one switch of the plurality of switches is activated to define the selected conduction path.

2. The test system of claim 1 further comprising test equipment configured to apply a first predefined electrical signal to at least one of the first plurality of conductive paths and to apply a second predefined electrical signal to at least one of the second plurality of conductive paths, the first and second predefined electrical signals sufficient to activate the at least one switch of the plurality of switches.

3. The test system of claim 2 further comprising an electrical measurement corresponding to at least one interface connection of the plurality of interface connections.

4. The test system of claim 3 wherein the electrical measurement identifies a fault corresponding to at least one interface connection of the plurality of interface connections.

5. The test system of claim 3 wherein the electrical measurement measures a reliability of at least one interface connection of the plurality of interface connections.

6. The test system of claim 1 further comprising at least M+N test nodes, wherein at least M×N electrical paths may be measured using the M+N test nodes, further wherein each electrical path includes at least one interface connection of the plurality of interface connections.

7. The test system of claim 1 wherein the plurality of switches are each a diode having an anode and a cathode.

8. The test system of claim 7 wherein:
each of the first plurality of the conductive paths are associated with a cathode of a subset of the plurality of diodes, the subset being associated with a respective connection point of the respective first group of connection points; and
each of the second plurality of conductive paths are associated with an anode of a second subset of the plurality of diodes, the second subset being associated with respective connection point of the respective second group of connection points.

9. The test system of claim 8 further comprising:
a test head configured to apply a first predefined voltage to at least one of the first plurality of conductive paths and to apply a second predefined voltage to at least one of the second plurality of conductive paths, the predefined voltages sufficient to forward bias at least one of the plurality of diodes.

10. The test system of claim 9 wherein the predefined voltages are sufficient to forward bias one of the plurality of diodes, and not forward bias the remaining plurality of diodes.

11. A test method comprising:
providing a printed circuit board defining a first plurality of conductive paths, each of the plurality of conductive paths associated with a respective first group of connection points;
providing a package defining a second plurality of conductive paths, each of the plurality of conductive paths associated a respective second group of connection points and comprising a switch;
providing an interposer between the printed circuit board and the package comprising a plurality of interface connections interconnecting individual connection points of the first group of connection points to individual connection points of the second group of connection points;
wherein each of the plurality of switches is associated with a corresponding interface connection such that an electrical signal may be provided between one of the first plurality of conductive paths through a respective interface connection to one of the second plurality of conductive paths;
applying a first electrical signal to at least one of the first plurality of conductive paths; and
applying a second electrical signal to at least one of the second plurality of conductive paths, wherein the first and second electrical signals sufficient to activate at least one of the plurality of switches to define a particular individual conductive path such that there is electrical continuity between at least one of the first plurality of conductive paths, at least two of the plurality of interface connections, and one of the second plurality of second conductive paths.

12. The test method of claim 11 further comprising obtaining an electrical characteristic of the at least one interconnection interface associated with the at least one activated switch.

13. The test method of claim 12 further comprising isolating a fault to at least one interface connection.

14. The test method of claim 12 further comprising characterizing the fault of at least one interface connection.

15. The test method of claim 12 further comprising measuring a reliability of at least one interface connection.

16. The test method of claim 11 wherein the plurality of switches are each a diode having an anode and a cathode.

17. The test method of claim 11 further comprising measuring M×N test paths, using M+N test nodes to electrically contact the conductive paths.

* * * * *